United States Patent
Chen et al.

(10) Patent No.: US 9,236,219 B2
(45) Date of Patent: Jan. 12, 2016

(54) MEASUREMENT OF LINE-EDGE-ROUGHNESS AND LINE-WIDTH-ROUGHNESS ON PRE-LAYERED STRUCTURES

(71) Applicant: Macronix International Co., Ltd., Hsinchu (TW)

(72) Inventors: Yu-Chung Chen, Taipei (TW); Shin-Chang Tsai, Hsin-Chu (TW); Ta-Hung Yang, Miaoli County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/886,631

(22) Filed: May 3, 2013

(65) Prior Publication Data

US 2014/0264016 A1    Sep. 18, 2014

Related U.S. Application Data

(60) Provisional application No. 61/778,426, filed on Mar. 13, 2013.

(51) Int. Cl.
*H01J 37/26* (2006.01)

(52) U.S. Cl.
CPC ..................... *H01J 37/26* (2013.01)

(58) Field of Classification Search
USPC .......................................... 250/307; 356/600
See application file for complete search history.

(56) References Cited

U.S. PATENT DOCUMENTS

| | | | | |
|---|---|---|---|---|
| 6,657,736 | B1* | 12/2003 | Finarov | G01B 11/24 356/237.5 |
| 7,354,684 | B2* | 4/2008 | Dersch | G03F 7/70433 382/144 |
| 7,485,873 | B2* | 2/2009 | Ward | B82Y 10/00 250/423 F |
| 7,888,638 | B2* | 2/2011 | Miyamoto et al. | 250/307 |
| 2005/0173633 | A1* | 8/2005 | Tanaka et al. | 250/311 |
| 2007/0114399 | A1* | 5/2007 | Sasajima | G01N 23/225 250/307 |
| 2007/0229852 | A1* | 10/2007 | Wack et al. | 356/625 |
| 2008/0144050 | A1* | 6/2008 | Shyu et al. | 356/636 |
| 2009/0114816 | A1* | 5/2009 | Tam et al. | 250/307 |
| 2011/0037988 | A1* | 2/2011 | Brill | 356/600 |

* cited by examiner

*Primary Examiner* — Phillip A Johnston
*Assistant Examiner* — Hsien Tsai
(74) *Attorney, Agent, or Firm* — Fish & Richardson P.C.

(57) ABSTRACT

Measurements of line roughness are separated into groups depending upon pre-layers. Image data collected from similar pre-layer types are considered together in order to separate effects of line roughness from distortion of measurements caused by the pre-layers. The resulting line roughness measurements are used to estimate an aspect of line quality.

21 Claims, 2 Drawing Sheets

MEASUREMENT OF LINE-EDGE-ROUGHNESS AND LINE-WIDTH-ROUGHNESS ON PRE-LAYERED STRUCTURES

CROSS-REFERENCE TO RELATED APPLICATIONS

This application claims the benefit of U.S. Provisional Application No. 61/778,426 filed on Mar. 13, 2013 and entitled MEASUREMENT OF LINE-EDGE-ROUGHNESS AND LINE-WIDTH-ROUGHNESS ON PRE-LAYERED STRUCTURES, the entire contents of which are hereby incorporated by reference.

BACKGROUND OF THE INVENTION

1. Field of the Invention

The present invention relates generally to semiconductor fabrication methods and, more particularly, to a method of estimating line-edge-roughness and line-width roughness.

2. Description of Related Art

Semiconductor devices commonly include elements having shapes and sizes that unavoidably deviate from their ideal reference forms. Measurement and characterization of such deviation can be an important technique for controlling yield and reliability of a semiconductor production process. As one example, a semiconductor device, especially one comprising repetitive patterns such as with memory devices, may contain patterns of closely-spaced parallel conducting lines that must be physically isolated from each other. The edges of these lines, although nominally smooth and straight, are inevitably somewhat rough and irregular when viewed at very small scales. The roughness and irregularity can be represented mathematically with measurements of line edge roughness (LER) and line width roughness (LWR).

Generally, greater degrees of LER and LWR correspond with greater levels of unreliability and, consequently, to lower yields in semiconductor production processes. Accordingly, methods of monitoring and analyzing LER/LWR are important aspects of semiconductor production processes. Estimates of LER and LWR can be obtained using methods known in the art in cases where images of the parallel lines are obtained under conditions that are uniform from one region to another. However, when pre-layers are introduced in portions of an integrated circuit pattern, the characteristics of the pre-layers tend to complicate, confuse, obscure, and distort the estimation of LER and LWR.

A need thus exists in the prior art for a method of measurement of LER and LWR that is adapted to account for pre-layers. A further need exists for a method of relating line quality to yield and reliability of an integrated circuit when pre-layers are present.

SUMMARY OF THE INVENTION

The present invention addresses these needs by providing, according to one implementation, a semiconductor structure that includes a plurality of line substructures disposed in a region of the structure and a plurality of types of pre-layers disposed over sub regions of the line substructures. The invention herein disclosed, further, may scan a line substructure to obtain data representing a raw line image. An implementation, still further, may section the data according to the sub regions, combine the sectioned data to create line images according to pre-layer types, and compute a measure of line roughness according to the combined line images. The scanning may comprise receiving image pixels according to the line substructure. In some embodiments, the scanning can be performed using a critical dimension scanning electron microscope (CD-SEM).

Sectioning the data may comprise grouping image pixels according to sub region dimensions. Additionally, or alternatively, data-sectioning may be implemented by applying a numerical method to the line images. The numerical method may comprise, in one embodiment, determining sub region boundaries by performing an edge detection calculation on the raw line image data.

According to an aspect of the invention, raw line image data may be processed to obtain measures of line edge roughness (LER) and/or line width roughness (LWR). Measures of line roughness may include one or more of root-mean-square (RMS) values of LER and LWR, height-height correlation function (HHCF) of LER and LWR, and a power spectral density function of LER and LWR.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages, and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1:
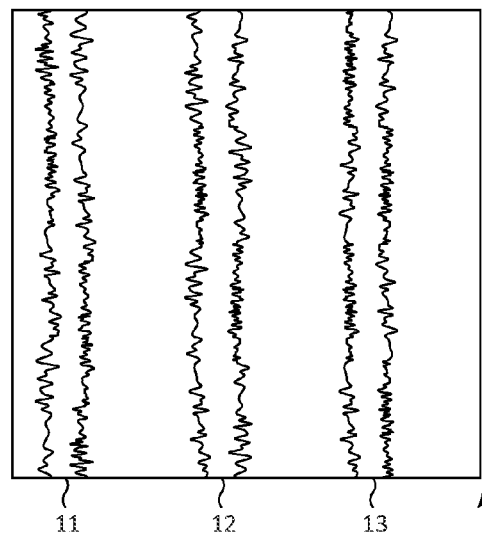
FIG. 1 is a pictorial representation of semiconductor line structures exhibiting exaggerated line edge roughness and line width roughness.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to estimation of line roughness in semiconductor structures and a related method of manufacture.

Referring more particularly to the drawings, FIG. 1 is a plan view of a region 10 of a semiconductor structure comprising line substructures 11, 12, and 13. Although ideal line substructure implementations would appear to be straight and to have smooth edges and uniform line widths, the illustrated lines are shown with exaggerated line roughness for illustration purposes. Further, the line substructures 11, 12, and 13 are shown as being separated from each other by a distance of approximately two to three times the width of a typical line. In practice, such lines are often more closely spaced than shown in the figure, the illustrated lines being shown relatively widely separated for clarity of description.

Fabricated lines that deviate from the ideal should be expected to degrade quality of the semiconductor structure in which they appear by decreasing reliability and/or yield of manufactured semiconductors according to the degree of deviation. For example, coupling between adjacent lines due to leakage and/or crosstalk effects may be exacerbated by the roughness. As a consequence, one measure of quality of an integrated circuit may take a form of estimating line roughness using one or more methods that are known and employed in the art. These methods, which may comprise analysis of data obtained by using, for example, a critical dimension scanning electron microscope (CD-SEM), may be used to compute measures of line edge roughness (LER) and/or line width roughness (LWR). Examples of such measures include estimation of root-mean-square (RMS) values, height-height correlation function (HHCF), power spectral density (PSD) and/or autocorrelation of LER and/or LWR based upon processing of data collected by a CD-SEM. These and other statistical techniques are used according to the invention for characterizing quality of line substructures in semiconductors.

The prior art methods summarized above operate best when it can be expressly or implicitly assumed that line characteristics and their deviations from ideal are uniform over an area of interest. With reference to FIG. 1, for example, in certain applications the area of interest may encompass the entire region 10. Such uniformity, when present, may, according to the invention, enable useful applications of known statistical methods for characterizing quality of line substructures.

Figure 2:
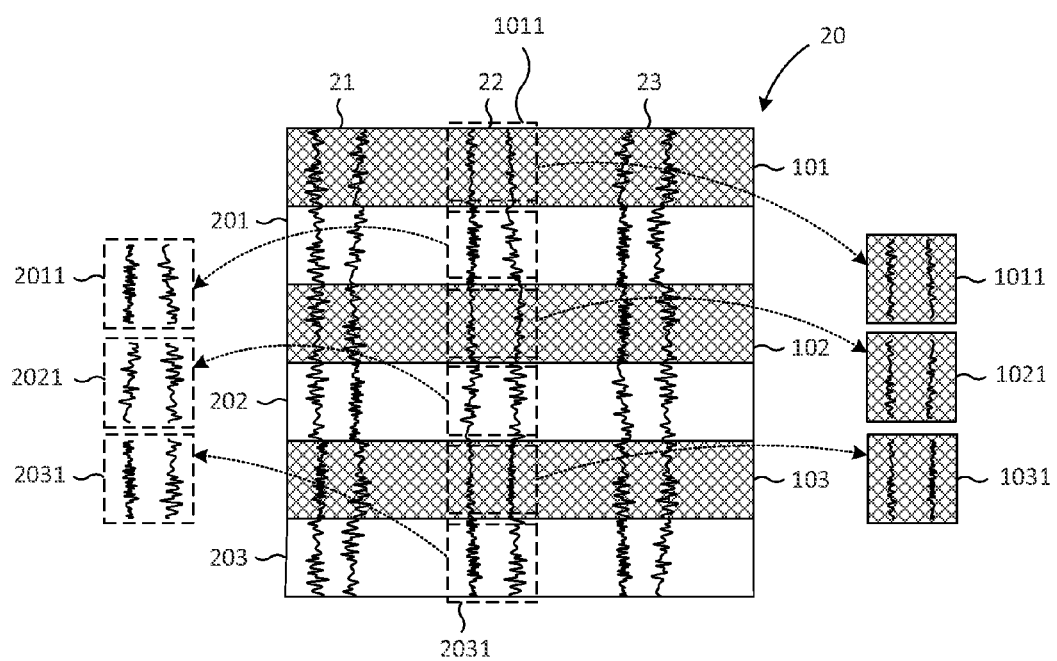
FIG. 2 is an illustration of semiconductor line structures with pre-layer overlays.

In common practice, however, substructures to be characterized may be more complicated, as with the highly-relevant case of line structures being overlaid with pre-layers at various stages of a semiconductor manufacturing process. FIG. 2 illustrates an example of one such case, in which a region 20 of a semiconductor structure comprises lines 21, 22, and 23 overlaid with pre-layers. A first type of pre-layer overlies the lines in sub regions 101, 102 and 103 as represented in the figure by horizontal bands. On the other hand, sub regions 201, 202, and 203, which may be disposed between respective sub regions 101, 102 and 103, are overlaid with a second type of pre-layer that differs from the first pre-layer. (It should be understood herein that one or more of the types of pre-layer may differ in location, structure, composition, or correspond to no pre-layer at all.) In the current case, rote application of prior art methods to attempt to characterize LER and/or LWR may lead to incorrect, misleading, or indeterminate results. This indeterminacy can occur as a consequence of the pre-layers altering (e.g., modulating) the line roughness data so that, although estimates of LER and/or LWR are influenced by and reflect the underlying LER/LWR properties, the estimates according to a feature of the invention are recognized further to be influenced by effects of the pre-layers.

Figure 3:
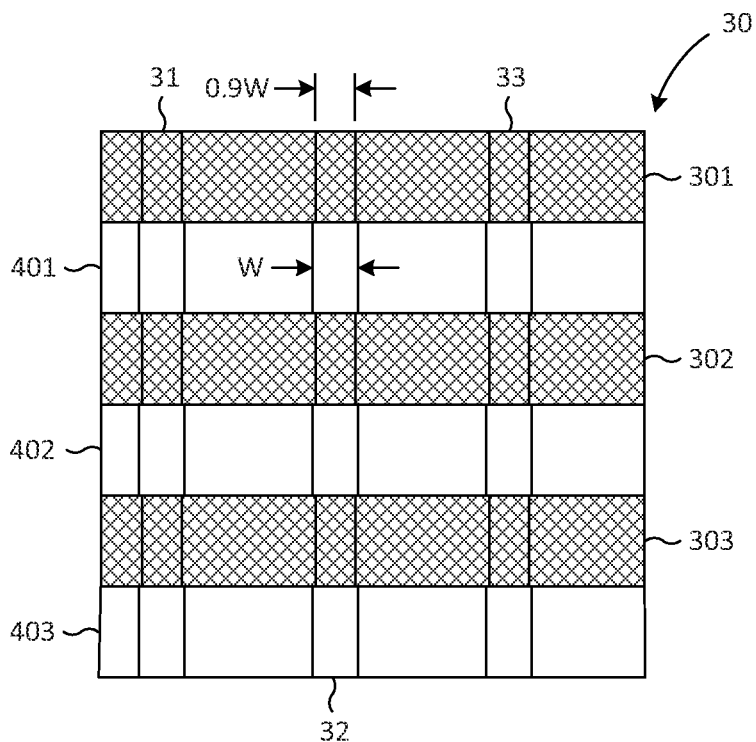
FIG. 3 is an idealized diagram of semiconductor line structures depicting an example of effects of pre-layers.

In the context of a simple illustration of the concept in relation to effects which may accompany pre-layers, consider the example of an idealized arrangement of semiconductor line structures as elucidated in FIG. 3. Following processing, a region 30 of the semiconductor structure has lines 31, 32, and 33, each of which is ideal with uniform width W and zero line width roughness. Here, the first type of pre-layer (i.e., the pre-layers in sub regions 301, 302 and 303) has an effect of scaling the apparent width of the line 32 by a factor of 0.9, and the effect of the second type of pre-layer (i.e., the pre-layers in sub regions 401, 402 and 403) is nil. That is, in the example, the sub regions 401, 402 and 403 are overlaid with no pre-layer. Assuming that the vertical widths of the sub regions 301, 302, 303, 401, 402, and 403 are identical, calculation of the RMS value for an estimate of LWR in this idealized instance yields $SQRT(\frac{1}{2}[(W-W)^2+(W-0.9\ W)^2]) \approx 0.0707\ W$. This estimate differs from the true RMS value of LWR (i.e., zero) by about 7% of the value of W, itself. Stated another way, with LWR normalized to line width, the RMS LWR in this example is estimated to be about 7%, whereas the true value of the RMS value of the LWR is zero.

To extend the previous example, use of prior methods, to the extent known, may be accompanied with establishment, e.g., of a criterion that relates reliability to line quality. Such a criterion (idealized for simplicity) might state that reliability is reduced by about 1% for each 1% increase in line roughness (normalized to line width). In the above example, a decrease in reliability of about 7% is predicted by the estimated RMS value of LWR when, in fact, the true decrease in reliability is zero. Clearly, application of the above 1% rule in the idealized example just presented yields grossly inaccurate results.

When a measure of line roughness (for example, an estimate of an RMS value of LWR) is computed in actual, non-idealized cases, the estimate is affected by the true LWR and also by effects of the pre-layers. When an RMS LER/LWR estimate for a line overlaid by different pre-layers in different portions of the line is expressed as a single number, true values of LER/LWR estimates are at least partially obscured by effects of the pre-layers. Any decision made as to line quality based upon the single-number estimate must be treated as suspect when pre-layers are present.

By recognizing that different pre-layers overlying different sub regions of a line can have an effect on measurements of LER/LWR, the present invention is able to address the problem just identified. With this recognition in mind, LER/LWR data for these different sub regions may be collected separately, and values for, e.g., RMS, HHCF, PSD and/or the like can be computed in groups according to pre-layer types.

Returning to FIG. 2, the three lines 21, 22 and 23 of the region 20 are overlaid with different pre-layers in horizontal strips, according to the design/processing symmetry mapped in the figure. Sub regions 101, 102 and 103 are overlaid with a first type of pre-layer, and a second type of pre-layer (which may be no pre-layer) overlies sub regions 201, 202 and 203. Focusing, for example, only on line 22, the line can be partitioned into six disjoint sections, half of which are overlaid by the first type of pre-layer, namely those sections corresponding to sub regions 101, 102 and 103. These sections are broken out (e.g. extracted), illustrated separately in the figure, and identified by reference designators 1011, 1021 and 1031. Similarly, three other disjoint sections of line 22 are overlaid by the second type of pre-layer. Those sections, corresponding to sub regions 201, 202 and 203, are identified with reference designators 2011, 2021 and 2031 and are also illustrated separately in the figure. The effect of the conceptual operations just described is to partition a single image of, for example, line 22 into collections of separate images based upon sub regions and then to recombine those images into two images according to pre-layer type. Each of these two images then may be analyzed to obtain pre-layer-dependent LER/LWR information. That is, sections 1011, 1021 and 1031, being overlaid with a first type of pre-layer, may be analyzed as one image; and sections 2011, 2021 and 2031 may analyzed as another image, those sections being overlaid with a second type of pre-layer.

Digital implementations of the conceptual outline just presented may embody processing steps performed by a circuit, processor, and/or computer, e.g., using software, after raw image data are collected by image acquisition equipment, e.g., the CD-SEM, and/or from another storage or data source. The data collection may comprise collecting, i.e., receiving, image pixels, and the sectioning of the data may result from processing, e.g., implemented by hardware and/or a software operation, that groups the image pixels according to sub region dimensions. The sub region dimensions, themselves, may be defined according to a priori information that defines the regions. Additionally, or alternatively, the sub region dimensions may be inferred from numerical analysis of the image pixel data. As one example, an edge detection algorithm may be used to identify sub region boundaries.

Figure 4:
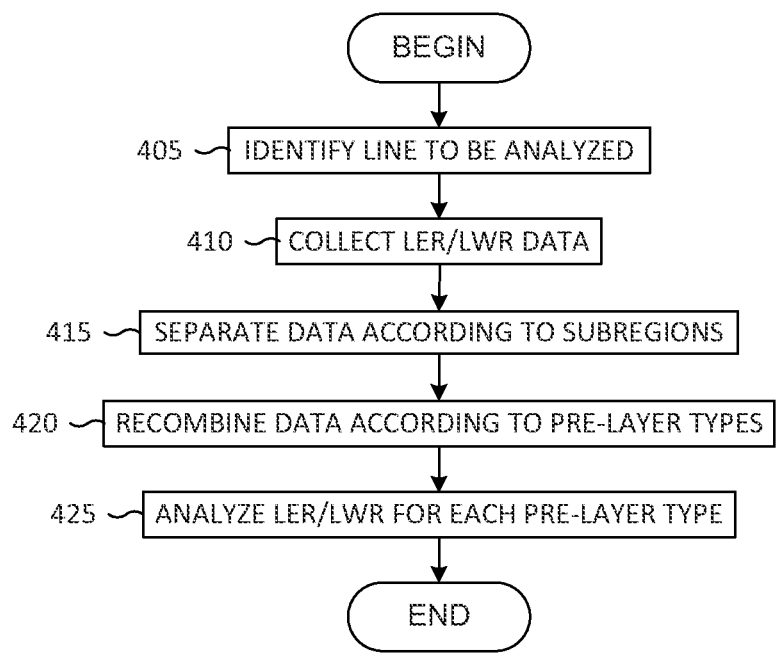
FIG. 4 is a flow diagram outlining an implementation of a method of the present invention.

An instance of a method of the present invention may be summarized via a general flow diagram as illustrated in FIG. 4. In the context of the depicted process, one or more elements of the combination of an image acquisition device, an input coupled to the image acquisition device, a microprocessor coupled to the input, and an arithmetic unit coupled to the microprocessor, can be used. According to the diagram, a line to be analyzed is identified at step 405. At step 410 LER/LWR data are collected using, e.g., an image acquisition device (operable to acquire image information from a plurality of line substructures of a semiconductor structure and to generate data representative of one or more raw line images), such as a CD-SEM in a typical embodiment.

Processing of the LER/LWR data may be performed by way of one or more of (a) an input, e.g., for receiving the data from the image acquisition device, the data corresponding to the plurality of line substructures, whereby the plurality of line substructures are disposed in a region of the semiconductor structure and a plurality of types of pre-layers are disposed over sub regions of the line substructures, (b) a microprocessor configured to section the data according to the sub regions and to combine the sectioned data to create combined line images according to pre-layer types, and (c) an arithmetic unit coupled to the microprocessor and constructed to compute a measure of line roughness according to the combined line images.

With reference to the figure, commencing at step 415, the process can proceed with separating the data according to sub regions. This separation may be accomplished, e.g., by image software or numerical methods. For example, the separation may be based upon sub regions of the line expressed in terms of pixel ranges determined by image software. Alternatively, the separation may be based upon analysis of measurement points (e.g., edge detection to determine pre-layer boundaries) using known numerical methods. Either or both of these or other techniques may be used to separate portions of a line according to different pre-layers.

With the data separated according to sub regions, the data may be recombined at step 420 according to the plurality of pre-layers, creating one image for each type of pre-layer under consideration. Characteristics of, e.g., images from, each of the plurality of pre-layers can then be analyzed at step 425 to obtain LER/LWR results for one or more of each pre-layer.

Returning to the discussion of FIG. 3, a more general prediction of reliability and/or yield based upon line roughness measurements may be developed that takes pre-layers into account. Returning to the idealized example illustrated in FIG. 3, analysis of LER/LWR data collected by a CD-SEM might be modified to apply a pre-distortion operation to data gathered in regions affected by the pre-layers. That is, based upon empirical observation and experience, an algorithm might, for example, scale all LWR measurements to offset the effect of the pre-layers, e.g., in all or selected areas. (In the illustrative example, LWR measurements would be scaled by dividing by 0.9.) Alternatively, the hypothetical 1% rule chosen in this example might be generalized in a two-pre-layer case to an m-n rule stating that yield is reduced by m×p %+n×q % where p is a roughness measure based upon a first pre-layer alone and q is a roughness measure based upon a second pre-layer taken alone. The m and n may be scale factors chosen according to empirical observation and experience. Additional forms of criteria based upon LWR/LER data collected and analyzed according to the present invention will occur to one skilled in the art.

The methods described herein are applicable to any semiconductor process/images for which LER/LWR calculations are or may be indicated. Examples include analysis of conducting line elements already described as well as characterization of channel lengths in metal oxide silicon field effect transistors (MOSFETs). These methods may advantageously replace known methods of semiconductor image analysis based upon calculation, e.g., using an arithmetic unit coupled to a microprocessor, of one or more of RMS values, HHCF, PSD and so on, using numerical analysis methods known for analyzing images, e.g., without pre-layers.

Although the disclosure herein refers to certain illustrated embodiments, it is to be understood that these embodiments have been presented by way of example rather than limitation. For example, although the methods introduced herein are described with reference to two pre-layer types, those methods can readily be extended by one skilled in the art to situations involving more than two pre-layer types and/or to a multitude of semiconductor production processes (and, indeed, most any semiconductor production process) as may be recognized by one skilled in the art as likely to benefit therefrom in view of this disclosure. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method, comprising:
providing a semiconductor structure including:
a plurality of line substructures disposed in a region of the structure; and a plurality of different types of pre-layers disposed over different sub-regions of the line substructures, each line substructure comprising a first plurality of sub-regions overlaid with a first type of pre-layer and a second plurality of sub-regions overlaid with a second type of pre-layer different from the first type of pre-layer;

scanning one of the line substructures to obtain data representing a single raw line image of the line substructure;

sectioning the data into a first collection of data representing images of the first plurality of sub-regions overlaid with a first type of pre-layer and a second collection of data representing images of the second plurality of sub-regions overlaid with a second type of pre-layer different from the first type of pre-layer;

combining the first collection of data to create a first combined line image for the first plurality of sub-regions;

combining the second collection of data to create a second combined line image for the second plurality of sub-regions; and computing a measure of line roughness for each of the first combined line image and the second combined line image.

2. The method as set forth in claim 1, wherein the scanning comprises receiving image pixels according to the line substructure.

3. The method as set forth in claim 1, wherein the scanning comprises scanning with a critical dimension scanning electron microscope.

4. The method as set forth in claim 2, wherein the sectioning comprises grouping image pixels according to sub region dimensions.

5. The method as set forth in claim 1, wherein the sectioning comprises applying a numerical method to the line images.

6. The method as set forth in claim 5, wherein the applying comprises determining sub region boundaries by performing an edge detection calculation.

7. The method as set forth in claim 1, wherein the computing comprises one or more of:
processing data to estimate line edge roughness; and
processing data to estimate line width roughness.

8. The method as set forth in claim 7, wherein the computing comprises computing a root-mean-square value of line edge roughness.

9. The method as set forth in claim 7, wherein the computing comprises computing a root-mean-square value of line width roughness.

10. The method as set forth in claim 7, wherein the computing comprises computing a height-height correlation function of line edge roughness.

11. The method as set forth in claim 7, wherein the computing comprises computing a height-height correlation function of line width roughness.

12. The method as set forth in claim 7, wherein the computing comprises computing a power spectral density function of line edge roughness.

13. The method as set forth in claim 7, wherein the computing comprises computing a power spectral density function of line width roughness.

14. The method as set forth in claim 1, further comprising calculating a quality estimate for the structure according to the measures of line roughness.

15. The method as set forth in claim 14, wherein the calculating comprises comparing the measure of line roughness with a line roughness criterion.

16. A processor configured to perform the method as set forth in claim 1.

17. A line-roughness measuring system, comprising:
an image acquisition device operable to acquire image information from a line substructure of a semiconductor structure and to generate data representative of a single raw line image of the line substructure;
an input for receiving the data from the image acquisition device, the data corresponding to the line substructure, the line substructure comprising a first plurality of sub-regions overlaid with a first type of pre-layer and a second plurality of sub-regions overlaid with a second type of pre-layer different from the first type of pre-layer;
a microprocessor configured to section the data into a first collection of data representing images of the first plurality of sub-regions overlaid with a first type of pre-layer and a second collection of data representing images of the second plurality of sub-regions overlaid with a second type of pre-layer different from the first type of pre-layer and to combine the first collection of data to create a first combined line image for the first plurality of sub-regions and to combine the second collection of data to create a second combined line image for the second plurality of sub-regions; and
an arithmetic unit coupled to the microprocessor and constructed to compute a measure of line roughness for each of the first combined line image and the second combined line image.

18. The system as set forth in claim 17, wherein the image acquisition device is configured to receive image pixels according to the line substructure.

19. The system as set forth in claim 17, wherein the image acquisition device comprises a critical dimension scanning electron microscope.

20. The system as set forth in claim 19, wherein the configuration of the microprocessor enables sectioning in the form of grouping image pixels according to sub region dimensions and application of a numerical method to the line images, wherein the application comprises a determination of sub region boundaries via one or more of the numerical method and edge detection, and wherein the computing comprises estimating one or more of line edge roughness and line width roughness.

21. A method, comprising:
providing a semiconductor structure including:
a plurality of line substructures disposed in a region of the semiconductor structure; and
a plurality of different types of pre-layers disposed over different sub-regions of each of the line substructures, each line substructure comprising a first plurality of sub-regions overlaid with a first type of pre-layer and a second plurality of sub-regions overlaid with a second type of pre-layer different from the first type of pre-layer;
scanning each of the line substructures over the different sub-regions to obtain data representing a single raw line image of each of the line substructures;
separating the data into separate images, each separate image being based on the different sub regions of each line substructure;
combining the separated data to create a plurality of combined line images, each combined line image including a different type of pre-layer; and computing a measure of line roughness for each of the plurality of combined line images.

* * * * *

UNITED STATES PATENT AND TRADEMARK OFFICE
CERTIFICATE OF CORRECTION

PATENT NO. : 9,236,219 B2  
APPLICATION NO. : 13/886631  
DATED : January 12, 2016  
INVENTOR(S) : Yu-Chung Chen, Shin-Chang Tsai and Ta-Hung Yang Page 1 of 1

It is certified that error appears in the above-identified patent and that said Letters Patent is hereby corrected as shown below:

Claims:

Column 7, lines 26-27, claim 2, delete "substructure." and insert -- substructures. --.

Column 7, lines 35-36, claim 5, delete "line images." and insert -- data. --.

Column 8, line 39, claim 20, delete "the" and insert -- a --.

Signed and Sealed this  
Tenth Day of May, 2016

Michelle K. Lee  
*Director of the United States Patent and Trademark Office*